United States Patent
Walther et al.

[11] Patent Number: 5,900,285
[45] Date of Patent: May 4, 1999

[54] METHOD OF MAKING A VESSEL HAVING A WALL SURFACE HAVING A BARRIER COATING

[75] Inventors: Marten Walther, Eubenheim; Martin Heming, Stromberg; Michael Spallek, Ingelheim; Gudrun Zschaschler, Zornheim, all of Germany

[73] Assignee: Schott Glaswerke, Mainz, Germany

[21] Appl. No.: 08/976,425

[22] Filed: Nov. 21, 1997

Related U.S. Application Data

[62] Division of application No. 08/549,180, Oct. 27, 1995, Pat. No. 5,736,207.

[30] Foreign Application Priority Data

Oct. 27, 1994 [DE] Germany .............................. 44 38 359

[51] Int. Cl.[6] .................. B05D 3/06; B05D 7/22
[52] U.S. Cl. .................. 427/491; 427/569; 427/576; 427/237; 427/238; 427/255.7; 427/575
[58] Field of Search .................. 427/237, 238, 427/575, 576, 491, 255.7; 428/35.7, 35.9, 36.7, 36.91

[56] References Cited

U.S. PATENT DOCUMENTS

| | | | |
|---|---|---|---|
| 4,552,791 | 11/1985 | Hahn | 428/35.7 |
| 4,764,405 | 8/1988 | Bauman et al. | 428/35 |
| 5,154,943 | 10/1992 | Etzkorn et al. | 427/56.9 |
| 5,364,666 | 11/1994 | Williams et al. | 427/579 |
| 5,378,510 | 1/1995 | Thomas et al. | 427/563 |
| 5,462,779 | 10/1995 | Misiano et al. | 428/36.6 |
| 5,508,075 | 4/1996 | Roulin et al. | 428/35.7 |
| 5,510,155 | 4/1996 | Williams et al. | 427/53.2 |
| 5,518,792 | 5/1996 | Masuda et al. | 428/36.6 |
| 5,545,375 | 8/1996 | Tropsha et al. | 220/45.6 |
| 5,547,723 | 8/1996 | Williams et al. | 428/36.6 |
| 5,654,054 | 8/1997 | Tropsha et al. | 428/36.6 |
| 5,677,010 | 10/1997 | Esser et al. | 427/489 |
| 5,679,412 | 10/1997 | Kuehnle et al. | 427/534 |

FOREIGN PATENT DOCUMENTS

| | | |
|---|---|---|
| 0460796 | 12/1991 | European Pat. Off. . |
| 0607573 | 7/1994 | European Pat. Off. . |
| 1-283136 | 11/1989 | Japan . |
| 4-014440 | 1/1992 | Japan . |
| 7-126419 | 5/1995 | Japan . |
| 2246795 | 2/1992 | United Kingdom . |
| WO93/24243 | 12/1993 | WIPO . |

OTHER PUBLICATIONS

"Insulator thin films formed by glow discharge and radiation techniques" by A. M. Mearns, Thin Solid Film, vol. 3, (1969) pp. 201 to 228.

"Synthesis of silicon nitride and silicon oxide films by ion–assisted deposition" R. P. Netterfield et al, Applied Optics, vol. 25, No. 21, Nov. 1986, pp. 3808 to 3809.

"Properties of Silicon Oxynitride Films Prepared by ECR Plasma CVD Method" by T. Hirao et al, Japanese Journal of Applied Physics, vol. 27, No. 1, Jan. 1988, pp. L21 to L23.

*Primary Examiner*—Roy V. King
*Attorney, Agent, or Firm*—Walter Ottesen

[57] ABSTRACT

A plastic vessel has a barrier coating comprising sequentially arranged barrier layers of organic polymer and of inorganic oxides, nitrides or oxynitrides. The barrier coating preferably has at least two inorganic barrier layers. The thickness of the inorganic barrier layers lies between 2 and 300 nm and the thickness of the organic barrier layer lies between 2 and 1000 nm. The total thickness of the layer packet should not exceed 0.1 mm.

9 Claims, 3 Drawing Sheets

METHOD OF MAKING A VESSEL HAVING A WALL SURFACE HAVING A BARRIER COATING

This is a divisional of application Ser. No. 08/549,180, filed on Oct. 27, 1995, now U.S. Pat. No. 5,736,207.

FIELD OF THE INVENTION

The invention relates to a vessel made of plastic having a barrier coating which includes a layer packet having at least two sequentially arranged barrier layers of different composition. The invention also relates to a method of making the vessel.

BACKGROUND OF THE INVENTION

Vessels made of plastic (for example, bottles and canisters) afford the following advantages with respect to known vessels made of glass or sheet metal: a low weight, a high degree of resistance to breakage and a reduced tendency to corrode combined with an advantageous performance when the vessel bursts. However, plastic vessels are disadvantageous because of the unsatisfactory barrier diffusion effectiveness of the plastic materials used. Depending upon the material used, the plastics permit more or less large quantities of oxygen, carbon dioxide, water vapor, solvents (alcohol, aromatic substances) and the like to diffuse.

Accordingly, experiments were made in plastic vessels to improve the barrier effectiveness against diffusion. Plastic vessels, which comprise one or more multi-layered laminates made of different plastics have not been accepted because the raw materials of the vessels are, in part, expensive and the vessels are complicated and therefore expensive to manufacture. Furthermore, the diffusion is still too great even for these laminate vessels so that a true long-term stability of, for example, more than a year is not obtainable.

Another solution comprises applying a so-called barrier layer to the surface of a plastic vessel. This barrier layer is intended to prevent the diffusion of gases and, if required, to prevent an attack by the material stored in the vessel on the plastic. In U.S. Pat. No. 4,552,791, a vessel is described having an outer surface which has a barrier coating of inorganic oxides. The function of the barrier coating is so described that the inorganic oxides partially penetrate into the polymer and clog the interstices and the porosity between the polymer chains. Most inorganic or metal oxides are suitable for this purpose. Oxides of silicon, aluminum, titanium and tantalum are preferred. The thickness of the oxide layer extends from less than 50 nm to over 500 nm. The coating is applied by means of a PVD (physical-vapor deposition) method by vaporization of the layer material in an electric field with the layer material being ionized by means of gas discharge. Although the diffusion barrier effectiveness is improved by a factor of 3 by this barrier coating, the result nonetheless needs improvement. For small layer thicknesses, the barrier effectiveness against diffusion is not satisfactory and for large layer thicknesses, the problem is presented that the layer peels especially when the vessel is subjected to sterilization in an autoclave.

European patent publication 0,460,796 (corresponding to U.S. patent application Ser. No. 07/513,353, filed Apr. 20, 1990, now U.S. Pat. No. 5,177,739 and Ser. No. 07/513,302, filed Apr. 20, 1990, now U.S. Pat. No. 5,084,356) discloses a vessel having an improved barrier effectiveness. This vessel has a diffusion barrier coating which comprises a packet of layers of two sequentially arranged inorganic barrier layers of different composition, namely, SiO and $SiO_2$. The SiO and $SiO_2$ layers alternate. The SiO layers have a thickness of 10 to 75 nm and the $SiO_2$ layers have a thickness of at least 20 nm. A considerable improvement of the barrier effectiveness against diffusion is provided by the buildup of two layers of different composition. However, the disadvantage is presented that a relatively thick coating is required for providing a good barrier effect. A thick coating tends, because of its brittleness, to form fissures and to peel off because the bendability and the capability of withstanding inner stresses is reduced with increasing thickness.

SUMMARY OF THE INVENTION

It is an object of the invention to provide a vessel of the kind referred to above wherein the barrier effectiveness is increased and a greater flexibility and higher mechanical stability of the barrier coating is provided. In addition, it is an object of the invention to be able to sterilize the vessel with its coating in an autoclave without difficulty.

The vessel of the invention includes: a vessel body made of plastic; a barrier coating in the form of a layer packet including at least two sequentially disposed barrier layers applied to the vessel body and being of different composition; a first one of the barrier layers being an inorganic barrier layer made of at least one of the following substances: oxides, nitrides, oxynitrides and a mixture of the oxides, nitrides and oxynitrides; and, a second one of the barrier layers being an organic barrier layer made of a polymer material.

The barrier coating comprises at least two sequentially arranged barrier layers of which one layer includes one or more inorganic oxides, nitrides or oxynitrides or a mixture thereof (inorganic layer) and the other layer includes an organic polymer material (organic layer). It has been shown that by applying this barrier coating, the barrier effectiveness of the coating and the mechanical stability are significantly increased.

Most metal oxides are suitable as inorganic oxides as disclosed in U.S. Pat. No. 4,552,791. In this context, metalloids are also understood to be included under metals. The oxides of silicon, aluminum, titanium, tin or tantalum are especially suitable. As a material for the inorganic layer, nitrides and oxynitrides are suitable insofar as they exhibit chemical stability with respect to the substances stored in the vessel and to the atmosphere. This also applies to the oxides. Suitable nitrides are, for example, boron nitrides, nitrides of aluminum and of silicon as well as of titanium.

The known compounds of the sial type are suitable as oxynitrides. However, silicon oxynitrides are also suitable for use. However, the use of oxides or nitride barrier layers is preferred because of the simple manufacture.

The thickness of the individual inorganic barrier layer should lie between 2 and 300 nm and preferably be between 5 and 200 nm.

As a material for the organic barrier layer, all polymer materials are suitable which are inert with respect to the materials to be stored in the vessel and which can be precipitated onto the wall of the vessel in the form of a layer. The organic barrier layer can be generated from a monomer with subsequent polymerization, for example, a plasma polymerization, UV polymerization or electron beam polymerization. Depending upon the conditions under which the organic barrier layer is applied, the polymer organic material can also contain oxygen or nitrogen atoms as known per se. It is preferable to apply the organic barrier layer by plasma polymerization.

Materials which are especially suitable for the organic barrier layer are, for example, polyethylene, parylene, polybutene, phthalocyanine, polypropylene, polystyrene or polymer precipitated from hexamethyldisiloxane by means of plasma polymerization.

The organic barrier layer should be 2 to 1,000 nm and especially 5 to 500 nm and very preferably 10 to 200 nm in thickness. It is difficult to generate a continuous uninterrupted film which has a layer thickness of less than 2 nm. The thickness of a layer packet containing several organic layers can easily become too great when utilizing layer thicknesses above 1,000 nm for the organic barrier layer.

The generation of thin films from the above-mentioned barrier coating materials has been known for many years. Various methods for generating organic polymer films are, for example, disclosed in the article of A. M. Mearns entitled "Insulator thin films formed by glow discharge and radiation techniques" published in "Thin Solid Films", 3 (1969), pages 201 to 228, Elsevier, Lausanne. Oxide nitride or oxynitride films can be produced pursuant to methods described, for example, in U.S. Pat. No. 5,154,943; in the article of R. P. Netterfield et al entitled "Synthesis of silicon nitride and silicon oxide films by ion-assisted deposition" in Applied Optics, Vol. 25, No. 21, pages 3808 and 3809 (1986) or in the article of T. Geraro et al entitled "Properties of silicon oxynitride films prepared by ECR plasma CVD method" published in the Japanese Journal of Applied Physics, Vol. 27, No. 1, January 1988, pages L21 to L23.

In the simplest case, the barrier coating comprises an inorganic and an organic barrier layer. However, it is preferable when at least two inorganic barrier layers are present in the barrier coating. The barrier coating can be so configured that, viewed from the surface of the vessel, first an inorganic barrier layer is provided, then an organic barrier layer follows and thereafter another inorganic barrier layer is applied. Another organic barrier layer can be provided on the inorganic barrier layer which is, however, not absolutely necessary. Viewed from the surface of the vessel, the barrier coating can, however, also start with an organic barrier layer and, in this case, with a coating of two inorganic barrier layers, the following layer sequence would be provided: organic/inorganic/organic/inorganic and, if necessary, still one more organic layer. Excellent results have been obtained with layer packets which have approximately 10 to 20 inorganic and organic layers having a thickness between 8 and 50 nm or 10 to 100 nm. However, the layer thickness of the entire layer packet should not exceed 0.1 mm and preferably not exceed 0.01 mm for reasons of process cost.

The first layer, viewed from the direction of the plastic vessel, can be an inorganic barrier layer. If this is the case, then it is advantageous to arrange an adherence promoter layer or primer between the inorganic layer and the vessel wall to improve adherence. Adherence promoter layers of this kind are known and can, for example, comprise silicon oxide, aluminum oxide, titanium oxide layers containing hydrocarbons. A further possibility comprises establishing active centers in the surface of the plastic vessel which effect the promotion of adherence. This can, for example, be achieved by ion etching or by a fluorene treatment. If the first barrier layer is an organic barrier layer, then an adherence promotion layer is generally not necessary. However, if the organic barrier layer does not exhibit good adherence to the vessel material, then such an adhesion promoter layer can be advantageous when an organic barrier layer is arranged as the first layer.

Inorganic and organic barrier layers must not be precisely separated from each other; instead, a zone can develop between these layers wherein the two layers mix. Furthermore, the organic barrier layer can contain up to 10 metal atoms per carbon atom with 0.1 to 5 metal atoms per carbon atom being preferred. Such organic layers which contain metal atoms can, for example, be generated by means of a PCVD (plasma-chemical-vapor-deposition) method from suitable organic and metalorganic precursor compounds. Organic layers of metalorganic precursors are especially advantageous because the inorganic layer adheres especially well thereto. Because of the chemical affinity, it is advantageous to use the same metal atoms in the organic layer as in the oxide layer. Accordingly, it is preferable when the organic layer contains such metal atoms which also occur in the oxide layer.

It is especially advantageous when the concentration of metal atoms in the organic barrier layer is not constant over the entire thickness of the layer; instead, the concentration should be less in the center than at the boundary surfaces of the organic barrier layer facing the inorganic layers. In this way, an especially good adherence effect of the inorganic barrier layer is obtained at the boundary surface; whereas, the organic characteristics of the layer reach their full extent in the center of the organic barrier layer.

Depending upon the manner of manufacture, the inorganic layer can also have built-in carbon atoms. This can especially occur when the inorganic layer is produced by decomposing metalorganic compounds. Depending upon the decomposition conditions, a more or less large portion of C-atoms then remains in the inorganic layer which is formed. These layers should not contain more than 0.1 C-atoms per metal atom and, however, at most 0.5 C-atoms per metal atom. Compared to purely inorganic layers, these layers afford the advantage that they have better adherence with respect to the organic layer. However, layers free of carbons or having a very low carbon content are generally preferred because of the better barrier effectiveness against diffusion.

Barrier coatings can be produced in any desired manner. Especially preferred, however, are the PVD (physical-vapor-deposition) method and the PCVD (plasma-chemical-vapor-deposition) method and especially, however, the PICVD (plasma-impulse-chemical-vapor-deposition) method. The PICVD method makes it especially easy to produce the entire barrier coating because the necessary individual layers with their different characteristics can be applied with the same process; whereas, only the actual inorganic barrier layer must be produced with high-vacuum vaporization and cathode atomization. In contrast, the organic layers can also be applied by other methods such as spraying liquid monomers or introducing gaseous monomers followed by polymerization. Both methods permit the buildup of a dense barrier coating without subjecting the substrate to intense temperature loads. The coating process in accordance with the PICVD method is facilitated when the organic and inorganic barrier layers are related (when they contain, for example, a common metal atom) because then a common layer forming gas can be used.

A reaction gas mixture of metalorganic compounds can be used in a PCVD or PICVD method. The metalorganic compounds include: HMDSO (hexamethyldisiloxane), TIPT (tetraisopropylorthotitanate) or trimethylaluminum and oxygen. If such a reaction gas mixture is used, for example, in a PCVD or PICVD method, then, depending upon the oxygen content, pure oxide layers or organic polymer layers having a content of corresponding metal atoms can be generated. If, for example, the silicon organic compound hexamethyldisiloxane is used, then, depending upon the oxygen content in the reaction gas and, if necessary, by changing the power parameters of the plasma process, layers can be generated which extend from pure $SiO_2$ layers to silicon resin layers.

It is, however, also possible to produce the organic and the inorganic layers from different starting gases. For example, the organic layer can be generated from hexamethyldisiloxane having low amounts of oxygen in the reaction gas mixture and the inorganic layer can be generated as a $TiO_2$ layer from $TiCl_4$. The oxides of silicon, titanium, aluminum, tin and tantalum have proven reliable as material for the inorganic barrier layer.

In lieu of the oxygen compounds for the inorganic barrier layer, the corresponding nitride compounds and oxynitride compounds can be used insofar as they are sufficiently chemically inert. Doping the inorganic barrier layer with Zr, Zn, In, Pb, W, Cu, Cr, Fe, Mn, Sb, Co, Ba, Mg as described in European patent publication 0,460,796 likewise positively influences the inorganic barrier layer of the invention. Mixtures of the above-mentioned compounds have likewise been shown to be suitable.

As a material for the vessel, all plastics used and known for this purpose are suitable insofar as they meet the coating conditions, that is, especially the thermal loading which occurs during coating. Very often, such vessels are produced in accordance with the injection molding, injection blow or film blowing methods. If a vessel is to be produced which can be thermally sterilized in an autoclave, then not all plastics are suitable as a vessel material. Plastics which can be autoclaved are, for example, polycarbonate, polypropylene, polyethylene, cyclical olefinpolymer, polybutene and polymethylpentene.

The barrier coating can be applied to the outer side of the vessel or to the inner side or on both sides thereof. In general, it is sufficient when one side of the vessel is coated. For sensitive content substances, it is recommended to apply the coating to the inner side of the vessel in order to prevent a contact of the content of the vessel with the vessel material. If a vessel is coated on both the inner and outer sides, then the vessel can be subjected to sterilization in an autoclave, even if the vessel is of a material which would otherwise not be sufficiently stable with respect to hot water vapor. For specific pharmaceutical applications, plastic vessels are often provided inside with a silicon layer or a hydrophobic organic layer in order to obtain a specific discharge performance. Such a slide layer can be applied additionally without difficulty to the barrier coating. Vessels coated in this manner are, for example, syringes wherein a smooth piston displacement is ensured by the slide coating.

A known manufacturing method for a slide coating provides for spraying silicon oil (silicon oil emulsion). It is furthermore conventional for expensive contents, to provide a layer on the inside wall of the vessel which makes possible a good discharge of the contents. Layers which are suitable for this purpose are silicon layers and layers containing fluorene. These layers can also be applied onto the barrier coating without difficulty by spraying or by a CVD process.

By building up the barrier coating as a layer packet having organic and inorganic barrier layers, an excellent barrier effect is obtained, on the one hand, while, on the other hand, the barrier coating exhibits excellent flexibility.

BRIEF DESCRIPTION OF THE DRAWINGS

The invention will now be described with respect to several examples with the aid of the following drawings wherein.

DESCRIPTION OF THE PREFERRED EMBODIMENTS OF THE INVENTION

In all of the examples which follow, the vessel used is made of polycarbonate (PC) manufactured from Makrolon 2458 of Bayer AG, Leverkusen, Germany. The vessels were in the form of small bottles or flasks and had an outer diameter in the cylindrical portion of 24 mm, a height of 58 mm, a wall thickness in the cylindrical portion of 1 mm and a useable volume of 18 ml. The diffusion values for the uncoated vessels with respect to 1 $m^2$ surface are as follows: $CO_2$: 687 $cm^3/m^2/d/bar$; $O_2$: 138 $cm^3/m^2/d/bar$; water: 2.5 $g/m^2/d$.

EXAMPLE 1

Figure 1:
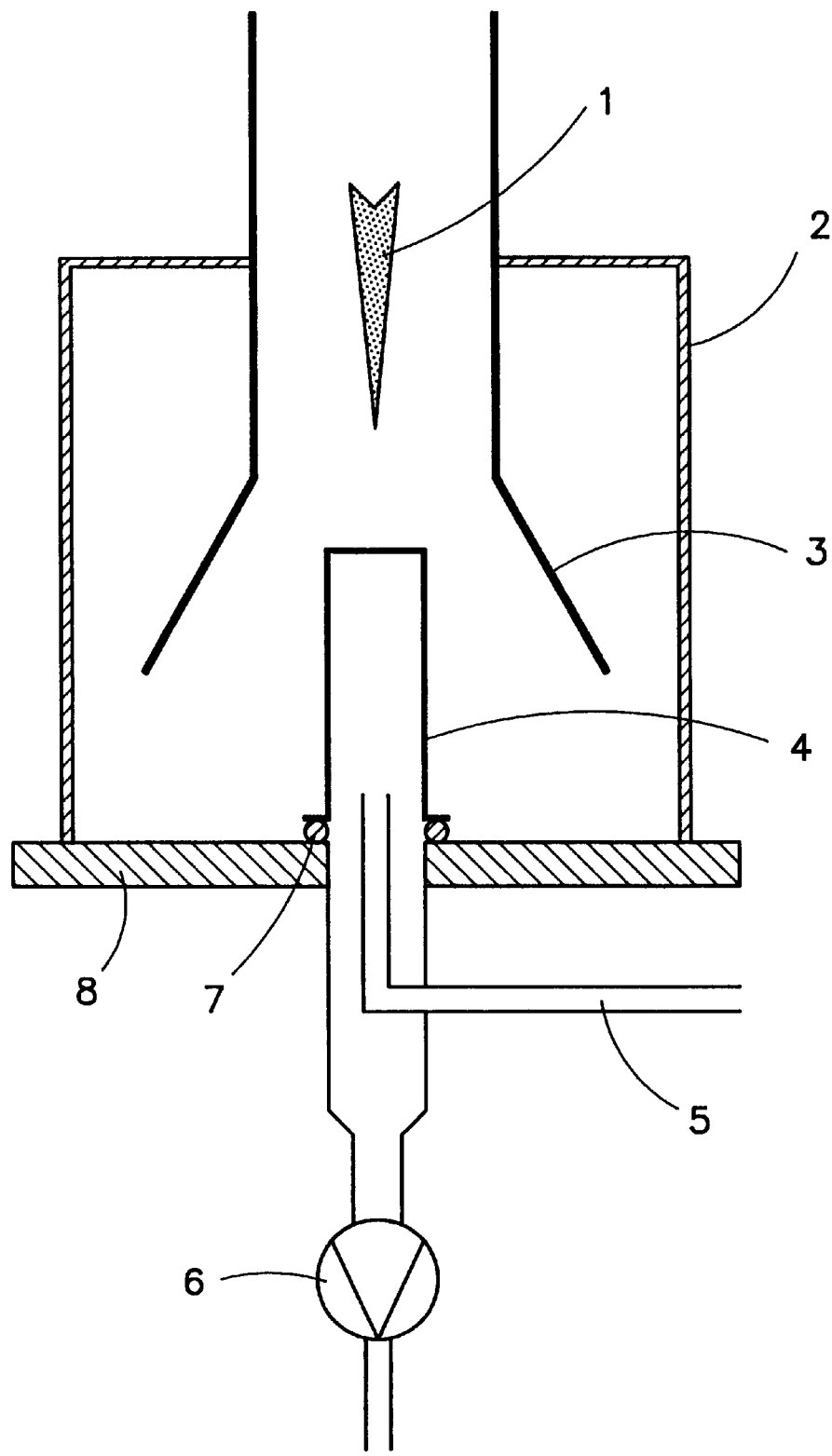
FIG. 1 is a schematic representation of an apparatus wherein layers are applied pursuant to the PICVD method.

The PC-vessel was coated with an inner coating comprising five inorganic barrier layers of $TiO_2$ each having a thickness of 20 nm and six organic barrier layers each having a thickness of 50 nm. An organic layer is applied to the vessel wall as a first layer. The fifth $TiO_2$ layer is covered with an organic barrier layer. The application of the layers takes place in accordance with the PICVD method in the apparatus shown schematically in FIG. 1. The apparatus comprises a metal base plate 8 which supports a metal microwave shield 2. The base plate 8 is provided with an opening for the vacuum line 6. The vessel 4 to be coated is seated on the opening and is sealed by means of a ring seal 7. The vessel is then evacuated via the line 6 to a pressure of 0.3 mbar. Microwave radiation 1 is directed in a pulsed manner via the microwave antenna 3 into the space conjointly defined by the shield 2 and the base plate 8. The microwave radiation forms a microwave plasma in the vessel 4. The interior of the vessel forms the reaction chamber. The reaction gas needed for layer formation is introduced via the gas feed 5. For the generation of the organic barrier layer, the pulse duration was 0.5 ms and for the generation of the inorganic barrier layer 1 ms. Each pulse pause during which consumed reaction gases were removed from the reaction chamber and replaced by fresh reaction gas was 100 ms. As soon as the desired layer thickness was generated for a barrier layer on the vessel wall, the reaction gas was replaced by the reaction gas needed for generating a further barrier layer. A mixture of both reaction gases can be introduced for generating a poorly defined transition between organic and inorganic barrier layers. The portion of the first reaction gas can be continuously reduced and simultaneously the portion of the second reaction gas can be continuously increased (up to the nominal value) to provide a uniform transition.

Figure 3:
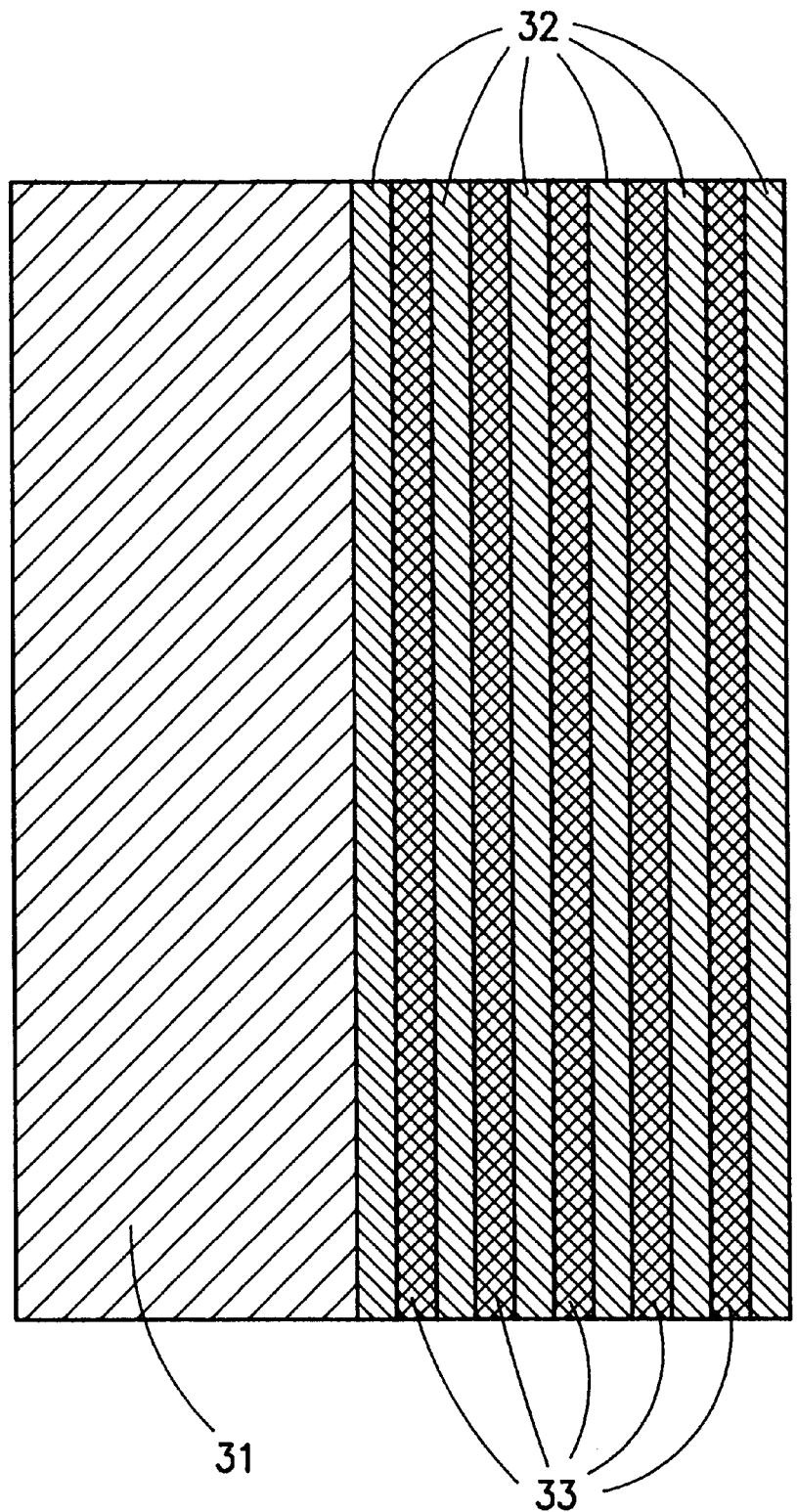

The PICVD method has been well known for a long time and is described, for example, in German Patent 4,008,405 as well as in U.S. Pat. No. 5,154,943. The inorganic barrier layer was generated from $TiCl_4$ and the organic barrier layer from hexamethyldisiloxane. The organic barrier layer contains 2 silicon atoms per carbon atom. FIG. 3 shows schematically and not to scale a section of the vessel wall. On the inner side of the vessel wall 31, organic barrier layers 32 and inorganic barrier layers 33 are alternately applied.

The diffusion values for the coated vessel were as follows: $CO_2$: 7.5 $cm^3/m^2/d/bar$ which constitutes an improvement by a factor of 92 compared to the uncoated vessel; $O_2$: 0.375 $cm^3/m^2/d/bar$ which constitutes an improvement by a factor of 370; and, water: 0.23 $g/m^2/d$ which constitutes an improvement by a factor of 11.

The resistance of the coated vessel with respect to a sterilization was then tested in the autoclave. The coated vessel was autoclaved for 30 minutes at 121° C. The vessel was then filled with acetone to make possibly occurring fissures visible. Fissures, if they occurred, were visible as white lines because acetone acts as a solvent for polycarbonate. No fissures could be found.

The stability of the barrier coating against the formation of fissures under mechanical load was determined in that the round cross section of the vessel 5 was subjected five times to loading to form an oval having 75% of the original diameter. No fissures were visible after the vessel was filled with acetone. For a comparison test, a $TiO_2$ layer having a thickness of only 100 nm was applied to the wall of the vessel. In the comparison test, numerous hairlike fissures developed under the same loading conditions.

EXAMPLES 2 to 16

In correspondence to Example 1, polycarbonate vessels were provided with a barrier coating. The first layer lying on the vessel wall as well as the last layer were each organic barrier layers, that is, the number of organic barrier layers was one more than that of the inorganic barrier layers. The organic barrier layers were applied in the same manner as in Example 1 and had the composition given in said example and each layer had a thickness of 70±10 nm. Vessels having a different number of inorganic barrier layers with different thicknesses and made of different materials were produced. The oxygen diffusion was determined for these vessels. In addition, the vessels were autoclaved as in Example 1 and investigated utilizing the acetone test in accordance with Example 1 and inspected for fissures resulting from autoclaving. Example 2 and Example 6 are comparison examples. The results are summarized in the table with only the inorganic layers being separately listed.

of Lichtenstein. The apparatus of FIG. 2 includes two different coating stations. A layer packet comprises three $SiO_2$ layers each having a thickness of 30 nm and four organic barrier layers produced from hexamethyldisiloxane and each having a thickness of 10 nm and a content of 2.5 Si-atoms per C-atom.

The apparatus comprises a base plate 215 which is provided with a vacuum connection stub 212. A vacuum bell 214 is connected vacuum tight to this base plate 215 by means of a seal 213. One of the coating stations comprises a spiral-wound filament 22 within which is mounted a SiO-pellet 211 which provides the material from which the inorganic barrier layer is to be generated. Energy is supplied to the spiral-wound filament via the lines 210.

The other coating station operates pursuant to the PCVD gas discharge process and comprises the electrode 23 and the high-voltage feed 29. The electrode 23 projects partially into the coated vessel 24 which is attached to the spindle 26 via a holding device 25. The spindle 26 can be lifted and lowered utilizing the handle 27 and can also be rotated so that the vessel 24 can be placed over the filament 22 for coating with SiO and over the electrode 23 for the purpose of being coated with the organic barrier layer. The electrode 23 is hollow so that hexamethyldisiloxane can be conducted into the vessel 24 via the line 28 and then be precipitated onto the inner wall surface of the vessel in the form of an organic layer by means of the high-voltage plasma.

Figure 2:
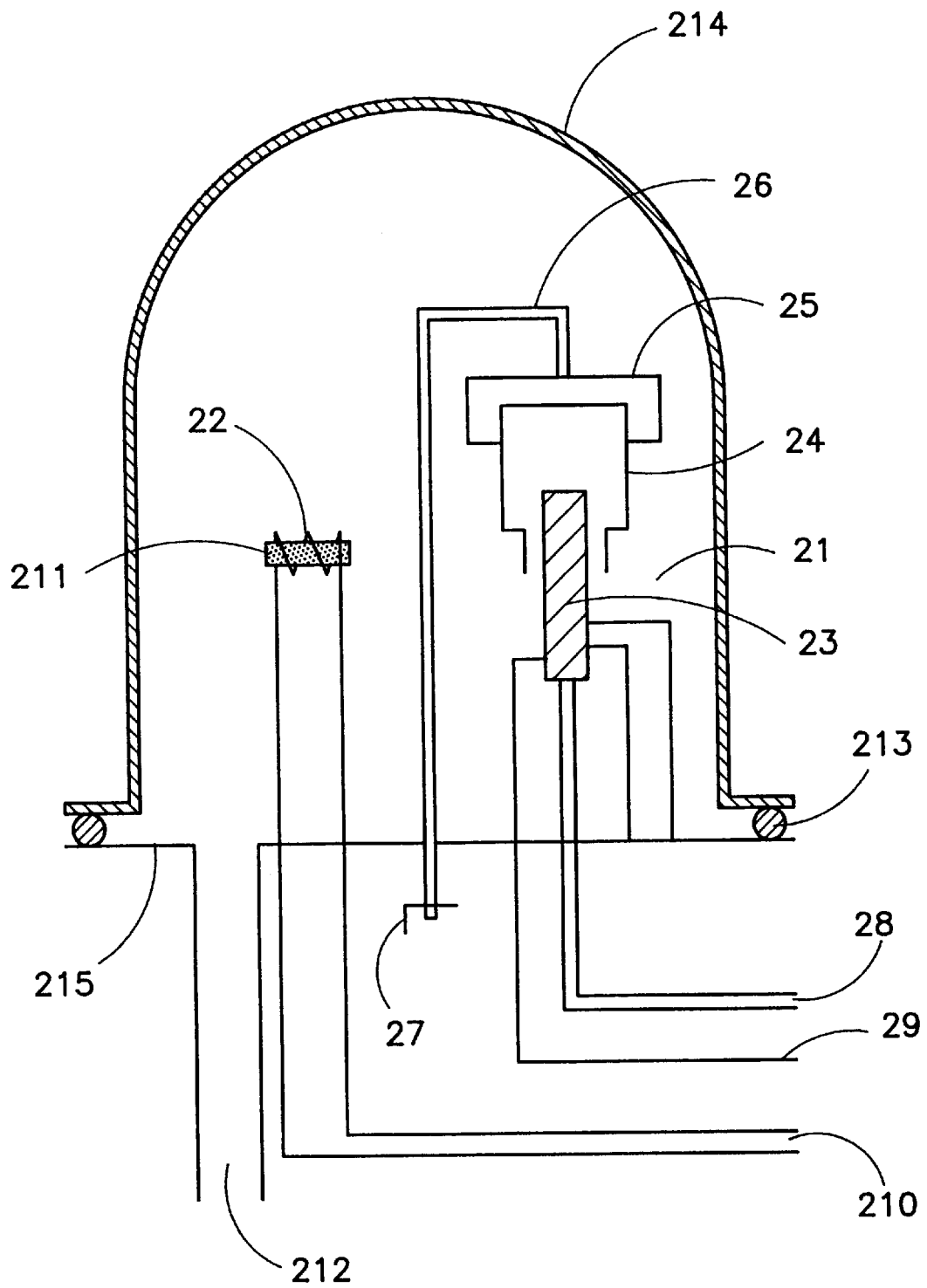
FIG. 2 shows a schematic representation of a high-vacuum vaporizing apparatus incorporating two different coating stations; and, FIG. 3 is a section view, not to scale, of a portion of a vessel coated with a plurality of organic and inorganic layers.

In the apparatus of FIG. 2, a pressure of 0.001 mbar is set and a direct voltage of −2.5 kV is applied to the electrode 23 so that a plasma discharge takes place in the hexamethyldisiloxane which is introduced. Here, a polymer organic barrier layer having a content of 2.5 Si-atoms per C-atom deposits on the inner wall surface of the vessel. As soon as the layer thickness of the organic barrier layer reaches 10 nm, the gas supply and the high voltage are switched off and the vessel is thereafter positioned over the spiral-wound filament 22 so that the filament is in the center of the vessel. At a pressure of 0.0001 mbar, SiO is vaporized from the SiO-pellet disposed within the filament when the filament is heated by means of an electrical current. The vaporized SiO then deposits on the inner wall surface of the vessel, that is, on the organic barrier layer which is already in place. After

TABLE

| Example No. | Material | Inorganic Layer Number of Layers | Layer Thickness (nm) | $O_2$ Diffusion ($cm^3/m^2/d/bar$) | Fissure Formation | Comment |
|---|---|---|---|---|---|---|
| 2 | | uncoated | | 138 | | comparison |
| 3 | $TiO_2$ | 5 | 20 | 0.375 | no | |
| 4 | $TiO_2$ | 5 | 8 | 1.83 | no | |
| 5 | $TiO_2$ | 2 | 50 | 0.45 | no | |
| 6 | $TiO_2$ | 1 | 500 | not measured | very intense | comparison |
| 7 | $TiO_2$ | 1 | 200 | 0.475 | no | |
| 8 | $SiO_2$ | 10 | 8 | 0.825 | no | |
| 9 | $TiO_2$ | 10 | 8 | 0.625 | no | |
| 10 | $TiO_2$ | 50 | 2 | 3.6 | no | |
| 12 | $TiO_2$ | 50 | 4 | 1.63 | no | |
| 13 | $TiO_2$ | 10 | 10 | 0.5 | no | |
| 14 | $SiO_2$ | 10 | 20 | 0.65 | no | |
| 15 | $TiO_2$ | 16 | 10 | 0.39 | no | |
| 16 | $SiO_2$ | 5 | 50 | 0.55 | no | |

EXAMPLE 17

FIG. 2 shows a high-vacuum vaporizing apparatus which is commercially available as type BA 510 from Balzers AG reaching a layer thickness of 30 nm, the vessel is again pivoted over the plasma coating station and the next organic layer is applied. In this manner, and without interrupting the vacuum, an additional three organic barrier layers and two inorganic barrier layers comprising SiO are applied so that the entire barrier coating of four organic barrier layers and three inorganic barrier layers results. The oxygen permeation amounted to 0.62 $cm^3/m^2/d/bar$ which corresponds to a reduction of the oxygen permeation by a factor of 222.

EXAMPLE 18

This example was carried out in an apparatus like that shown in FIG. 2 but with the difference that, in lieu of the plasma coating station, a further vaporization station was provided having a heated tungsten crucible in which paracyclophane is disposed. When heated, the paracyclophane is pyrolized to monomer biradical p-xylylene which polymerizes to a poly-p-xylylene film (also known as polyparaxylol film or parylene film) at a temperature below 35° C. On the inner side of the vessel, starting with a 10 nm thick parylene layer, a total of four 10 nm thick parylene layers and three 30 nm thick SiO-layers are applied alternately. The $CO_2$ permeation for this coating amounts to 8.3 $cm^3/m^2/d/bar$ which corresponds to a reduction by a factor of 83 of the $CO_2$ permeation with respect to the uncoated vessel.

EXAMPLE 19

As in Example 1, a vessel was coated with six organic barrier layers each having a thickness of 50 nm and being produced from hexamethyldisiloxane and five inorganic barrier layers of $TiO_2$. Each of the inorganic barrier layers was arranged between a corresponding pair of two mutually adjacent ones of the organic barrier layers. The organic barrier layers contained 3.3 Si-atoms per C-atom. The first layer applied to the vessel wall was an organic barrier layer. The inorganic barrier layers had different thicknesses when viewed in the direction from the vessel wall, namely: 50 nm, 40 nm, 30 nm, 20 nm and 10 nm. The vessel coated in this manner exhibited an $O_2$-diffusion of 0.42 $cm^3/m^2/d/bar$. An acetone attack after autoclaving was not detected.

EXAMPLE 20

A barrier coating of five inorganic and six organic barrier layers was generated in accordance with the method described for Example 1. The inorganic barrier layers had a different composition and different thickness. The organic barrier layers had a thickness and a composition corresponding to that of Example 19. Viewed from the direction of the vessel wall, the inorganic barrier layers were arranged as follows: 30 nm $TiO_2$, 20 nm $SiO_2$, 30 nm $TiO_2$, 20 nm $SiO_2$ and 30 nm $TiO_2$. The vessels exhibited an $O_2$-diffusion of 0.48 $cm^3/m^2/d/bar$. An acetone attack could not be determined.

EXAMPLE 21

In a manner similar to Example 1, a vessel was coated with five inorganic barrier layers of $TiO_2$ having a thickness of 50 nm and six organic barrier layers produced from hexamethyldisiloxane. The organic barrier layers had an anisotropic distribution of the metal atoms in the layer. The organic barrier layers had a thickness each of 50 nm. The ratio Si:C was at the boundary surfaces approximately six Si-atoms per C-atom and then dropped approximately parabolically to the center of the organic barrier layer to three Si-atoms per C-atom. The oxygen diffusion for the coated vessel amounted to 0.43 $cm^3/m^2/d/bar$. An acetone attack after autoclaving was not determined.

It is understood that the foregoing description is that of the preferred embodiments of the invention and that various changes and modifications may be made thereto without departing from the spirit and scope of the invention as defined in the appended claims.

What is claimed is:

1. The method of making a plastic vessel having a wall surface having a barrier coating, the method comprising the steps of:

sequentially depositing individual inorganic and individual organic barrier layers to said wall surface by the PCVD (Plasma-Chemical-Vapor-Depositing) process to define said barrier coating with the first barrier layer deposited on and in contact with said wall surface always being organic and the last barrier layer deposited and in contact with a substance stored in said vessel always being inorganic;

ending the application of said barrier layers when at least one inorganic barrier layer has been applied and at least one organic barrier layer has been applied;

the inorganic barrier layer being made of at least one of the following substances: oxides, nitrides, oxynitrides and a mixture of said oxides, nitrides and oxynitrides; and, the organic barrier layer being made of an organic polymer material.

2. The method of claim 1, wherein the inorganic barrier layers are applied to have a thickness of 2 to 300 nm and the organic barrier layers are applied to have a thickness of 2 to 1,000 nm.

3. The method of claim 1, wherein the individual ones of said layers are applied utilizing a PICVD (Plasma-Impulse-Chemical-Vapor-Deposition) process.

4. The method of claim 1, wherein said barrier layers are applied so that said barrier coating has an overall thickness of at most 0.1 mm.

5. The method of claim 1, wherein said individual barrier layers are deposited only by said PCVD (Plasma-Chemical-Vapor-Deposition) process.

6. A method of making a plastic vessel having a wall surface having a barrier coating, the method comprising the steps of:

sequentially depositing-individual inorganic and individual organic barrier layers on said wall surface by the PCVD process (Plasma-Chemical-Vapor-Deposition) to thereby define said barrier coating;

ending the application of said barrier layers when at least one inorganic barrier layer has been applied and at least one organic barrier layer has been applied;

the inorganic barrier layer being made of at least one of the following substances: oxides, nitrides, oxynitrides and a mixture of said oxides, nitrides and oxynitrides;

the organic barrier layer being made of an organic polymer material; and, the organic barrier layer being doped with 0.1 to 10 metal atoms per carbon atom.

7. A method of making a plastic vessel having a wall surface having a barrier coating, the method comprising the steps of:

sequentially depositing individual inorganic and individual organic barrier layers on said wall surface by the PCVD process (Plasma-Chemical-Vapor-Deposition) to thereby define said barrier coating;

ending the application of said barrier layers when at least one inorganic barrier layer has been applied and at least one organic barrier layer has been applied;

the inorganic barrier layer being made of at least one of the following substances: oxides, nitrides, and oxynitrides and a mixture of said oxides, nitrides and oxynitrides;

the organic barrier layer being made of an organic polymer material; and the organic barrier layer and said inorganic barrier layer being doped with the same metal atoms.

8. The method of claim 7, wherein the organic barrier layer and the adjoining inorganic barrier layer conjointly define a boundary interface; and, wherein said organic barrier layer contains metal atoms and the content of said metal atoms varies over the thickness of said organic barrier layer with said content being less at the center of said organic barrier layer than at said boundary interface.

9. A method of making a plastic vessel having a wall surface having a barrier coating, the method comprising the steps of:

sequentially depositing individual inorganic and individual organic barrier layers on said wall surface by the PCVD process (Plasma-Chemical-Vapor-Depositing) to thereby define said barrier coating;

ending the application of said barrier layers when at least one inorganic barrier layer has been applied and at least one organic barrier layer has been applied;

the inorganic barrier layer being made of at least one of the following substances: oxides, nitrides, oxynitrides and a mixture of said oxides, nitrides and oxynitrides;

the organic barrier layer being made of an organic polymer material; and said individual barrier layers being so deposited that said inorganic barrier layer and the adjoining organic barrier layer conjointly define a transition region wherein the composition of the inorganic barrier layer changes continuously into the composition of the organic barrier layer.

* * * * *